United States Patent

Takahashi

[15] 3,655,996

[45] Apr. 11, 1972

[54] PROTECTIVE CIRCUIT FOR INPUT CIRCUIT OF JUNCTION TYPE FIELD EFFECT TRANSISTOR

[72] Inventor: Toru Takahashi, Tokyo, Japan

[73] Assignee: Iwatsu Electric Company, Limited, Tokyo, Japan

[22] Filed: Mar. 9, 1970

[21] Appl. No.: 17,489

[30] Foreign Application Priority Data

Mar. 13, 1969 Japan....................................44/19004

[52] U.S. Cl...................................307/202, 307/251, 307/304

[51] Int. Cl........................................H02h 7/20, H03k 17/60

[58] Field of Search...................................307/202, 251, 304

[56] References Cited

UNITED STATES PATENTS 3,134,033 5/1964 Cepuch et al...........................307/202

3,348,155 10/1967 Recklinghausen.................307/304 X 3,395,290 7/1968 Farina et al.............................307/202

*Primary Examiner*—John S. Heyman

*Attorney*—Chittick, Pfund, Birch, Samuels & Gauthier

[57] ABSTRACT

In a protective circuit for input circuit of a junction type field effect transistor, a plurality of gate electrodes are provided for the transistor, an input protective resistor is connected between a signal input terminal and an input side gate electrode and the other gate electrode is connected to the source electrode of the field effect transistor. The protective resistor functions to protect the field effect transistor against excessive forward voltage by passing current between the input side gate electrode and the source electrode and against excessive reverse voltage by passing current between the other gate electrode and the input side gate electrode.

5 Claims, 5 Drawing Figures

Patented April 11, 1972 3,655,996
FIG. 1
PRIOR ART
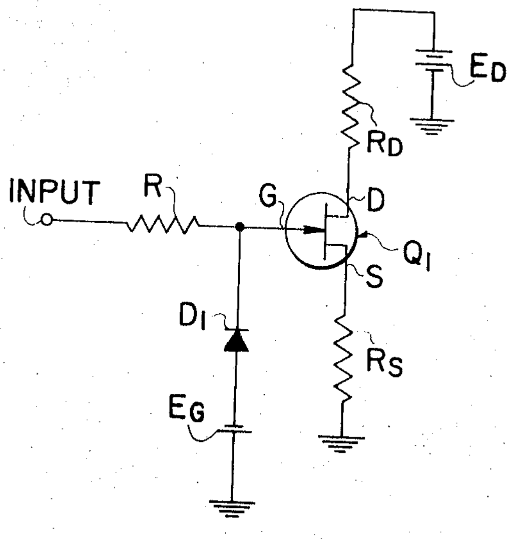
FIG. 2
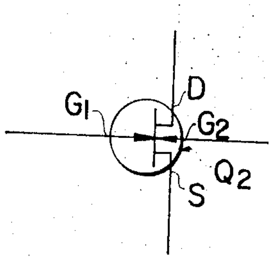
FIG. 4
FIG. 3, FIG. 5
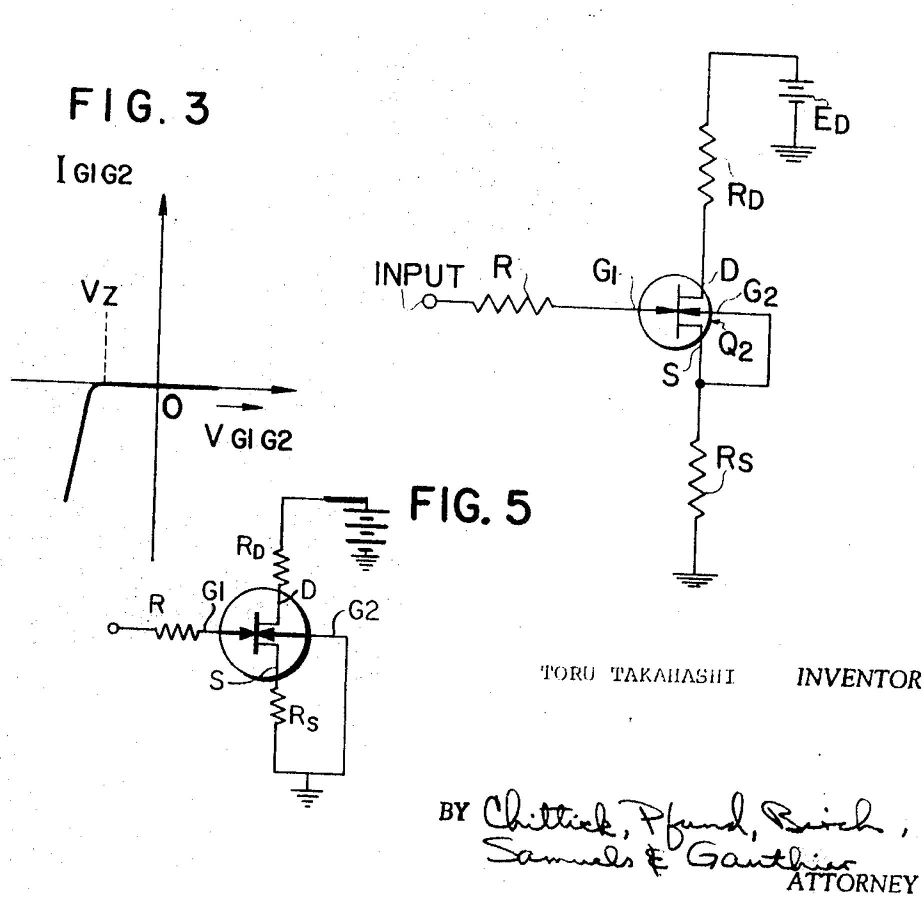
TORU TAKAHASHI INVENTOR
BY Chittick, Pfund, Birch, Samuels & Gauthier
ATTORNEY

PROTECTIVE CIRCUIT FOR INPUT CIRCUIT OF JUNCTION TYPE FIELD EFFECT TRANSISTOR

BACKGROUND OF THE INVENTION

This invention relates to a protective circuit for an input circuit of a junction type field effect transistor.

In an input circuit of a junction type field effect transistor, where an excessively large input is applied it is necessary to provide a suitable protective device so as to assure not to permit the gate-source voltage and gate-drain voltage to exceed the rating of the field effect transistor. The protective circuit which has been commonly used heretobefore comprises a high resistance connected in series with the gate electrode which provides the required protective function against forward excessive voltage by passing a gate current and a gate protecting diode and a high resistance which are connected to the gate electrode to protect it against excessive voltages in the reverse direction. Where such a field effect transistor circuit is utilized as the input circuit for an oscilloscope the protective diode should have a low reverse current and small change in the junction capacitance due to reverse voltage. However such a diode is relatively expensive.

SUMMARY OF THE INVENTION

It is an object of this invention to provide a novel protective circuit for an input circuit of a field effect transistor which can provide satisfactory protection against excessive voltage without utilizing a diode.

Another object of this is to provide a novel input protective circuit for a junction type field effect transistor wherein the capacitance of the input circuit can be decreased.

In accordance with this invention there is provided a protective circuit for an input circuit of a junction type field effect transistor including a plurality of gate electrodes, a source electrode and a drain electrode, comprising an input protective resistor connected between a signal input terminal and an input side gate electrode of the transistor and means to connect the other gate electrode to the source electrode directly or through a negative bias resistor. The protective resistor connected in this manner functions to protect the field effect transistor against excessive voltage in the forward direction by passing current between the input side gate electrode and the source electrode and against excessive voltage in the reverse direction by passing current between the other gate electrode and the input side gate electrode.

BRIEF DESCRIPTION OF THE INVENTION

In the accompanying drawing:

FIG. 1 shows a prior art protective circuit for an input circuit of a junction type field effect transistor;

FIG. 2 is a diagrammatic representation of a junction type field effect transistor employed in this invention;

FIG. 3 shows a characteristic curve of the junction type field effect transistor shown in FIG. 2 and FIG. 4 is a diagram illustrating one embodiment of this invention.

FIG. 5 is a partial schematic showing modifications.

DESCRIPTION OF THE PREFERRED EMBODIMENT

In order to have better understanding of this invention reference is first made to a prior art protective circuit for an input circuit of a N channel type junction field effect transistor shown in FIG. 1. As shown, a drain electrode D of a field effect transistor $Q_1$ is connected to a positive pole of a source of supply $E_D$ through a load resistor $R_D$ and a source electrode S is grounded through a source bias resistor Rs. A gate electrode G is connected to an input terminal INPUT through an input protective resistor R of relatively high value. The gate electrode G is also grounded through an input protective diode $D_1$ and a source of negative bias $E_G$ therefor.

With this circuit arrangement, upon application of an excessive voltage in the forward direction the gate electrode G of the transistor $Q_1$ is biased positively with respect to the source electrode S thus passing a gate current to create a voltage drop across a resistor R. Accordingly, by proper selection of the value of resistor R it is possible to protect excessive voltages up to definite value. On the other hand, in the absence of the diode $D_1$, the maximum input voltage is determined by the breakdown voltage between the gate and source electrodes for excessive voltages in the reverse direction. However, when the cathode electrode of diode $D_1$ is connected to gate electrode G of the field effect transistor $Q_1$ and the anode electrode of the diode to the negative source $E_G$ diode $D_1$ will become conductive when the potential of the gate electrode G is lower than that of the source $E_G$ so that it is possible to protect the field effect transistor $Q_1$ up to the definite voltage by the voltage drop across resistor R. However, as has been pointed out before in the input protective circuit requiring a high input resistance the diode $D_1$ is required to have small reverse current which is of course expensive.

A preferred embodiment of this invention will now be described with reference to FIGS. 2 to 4. FIG. 2 is a diagrammatic representation of a modified junction type field effect transistor having a plurality of, for example two, gate electrodes $G_1$ and $G_2$, and suitable for use in this invention. The voltage-current characteristic between these gate electrodes is illustrated in FIG. 3. As shown in this figure, at a certain voltage $V_z$, current begins to flow abruptly. With gate electrodes $G_1$ and $G_2$ suitably arranged it is possible to select the voltage $V_z$ to be sufficiently smaller than the breakdown voltage between the gate and source electrodes and the gate and drain electrodes.

FIG. 4 illustrates one embodiment of this invention wherein a drain electrode D of a junction type field effect transistor $Q_2$ having the voltage current characteristic as shown in FIG. 3 is connected to the positive pole of a source $E_D$ through a load resistor $R_D$ and a source electrode S is grounded through a bias resistor $R_s$. One of the gate electrode $G_1$ connected to an input terminal INPUT via an input protective resistor R of relatively high value while the other gate electrode $G_2$ is connected directly to the source electrode S. Alternatively, as shown in FIG. 5, gate electrodes $G_2$ may be directly grounded so as to be negatively biased with respect to source electrode S by the voltage drop across resistor Rs.

With this arrangement, upon application of an excessive voltage in the forward direction, current will flow from gate electrode $G_1$ to source electrode S so as to protect the field effect transistor by the voltage drop across resistor R. On the other hand, upon application of an excessive voltage in the reverse direction current will flow from gate electrode $G_2$ to gate electrode $G_1$ at the threshold voltage $V_z$, shown in FIG. 3 with the result that the field effect transistor $Q_2$ can equally be protected against excessive current in the reverse direction by the voltage drop across resistor R. Although the junction type field effect transistor has been shown in FIG. 4 as a N channel type it is to be understood that a junction type field effect transistor of P channel type can also be used with equal results.

Thus, this invention provides a novel protective circuit wherein the desired protection is afforded by a protective resistor connected in circuit with the gate electrode against voltages of forward and reverse directions without the necessity of utilizing any protective diode as in the prior art. Since the junction capacitance of the diode is not connected in parallel with the junction type field effect transistor it is possible to decrease the capacitance of the input circuit.

While the invention has been shown and described in terms of a preferred embodiment thereof, it is to be understood that the invention is not limited thereto and that many changes and modifications may be made without departing from the true spirit and scope of the invention as defined in the appended claims.

What is claimed is:

1. A protective circuit for an input circuit of a junction type field effect transistor including at least first and second oppositely poled gate electrodes, a source electrode and a drain electrode, comprising an input protective resistor connected between a signal input terminal and said first gate electrode of said transistor, and means to connect said second gate electrode to have a predetermined potential relative to said source electrode, said protective resistor operative in combination only with the unidirectional conduction characteristics of said first and said second gate electrodes to protect said field effect transistor against excessive voltages in the forward direction by passing current between said first gate electrode and said source electrode and against excessive voltages in the reverse direction by passing current between said second gate electrode and said first gate electrode.

2. The protective circuit according to claim 1 wherein said second gate electrode is connected to said source electrode through a bias resistor so as to be biased reversely with respect to said source electrode.

3. The protective circuit according to claim 1 wherein said junction type field effect transistor is of the N channel type.

4. The protective circuit according to claim 1 wherein said junction type field effect transistor is of the P channel type.

5. The protective circuit according to claim 1 wherein said second gate electrode is connected to have the same potential as said source electrode.

* * * * *